(12) United States Patent
Provencal

(10) Patent No.: US 8,214,425 B2
(45) Date of Patent: Jul. 3, 2012

(54) SYSTEM AND METHOD FOR STORING A PROGRAM USING PARTIAL COMPRESSION

(75) Inventor: Paul Provencal, Gatineau (CA)

(73) Assignee: Mitel Networks Corporation, Ottawa Ontario (CA)

( * ) Notice: Subject to any disclaimer, the term of this patent is extended or adjusted under 35 U.S.C. 154(b) by 1160 days.

(21) Appl. No.: 12/012,124

(22) Filed: Jan. 29, 2008

(65) Prior Publication Data

US 2009/0193040 A1    Jul. 30, 2009

(51) Int. Cl.
*G06F 15/16* (2006.01)
*H03M 7/00* (2006.01)
*G06F 13/14* (2006.01)
*G06F 15/177* (2006.01)

(52) U.S. Cl. ............ 709/203; 709/247; 341/50; 710/68; 711/100; 713/2

(58) Field of Classification Search ............... 341/50; 709/203, 247; 710/68; 713/2
See application file for complete search history.

(56) References Cited

U.S. PATENT DOCUMENTS

| | | | |
|---|---|---|---|
| 5,530,847 A | | 6/1996 | Schieve et al. |
| 5,836,013 A | * | 11/1998 | Greene et al. .................. 713/2 |
| 6,282,643 B1 | | 8/2001 | Cromer et al. |
| 6,532,121 B1 | * | 3/2003 | Rust et al. ...................... 360/8 |
| 7,039,769 B2 | * | 5/2006 | Castelli et al. .............. 711/147 |
| 7,200,603 B1 | * | 4/2007 | Hitz et al. ......................... 1/1 |
| 7,451,290 B2 | * | 11/2008 | Chandrasekaran et al. .. 711/171 |
| 2001/0001872 A1 | * | 5/2001 | Singh et al. ................. 711/129 |
| 2003/0159025 A1 | * | 8/2003 | Dubal ............................ 713/1 |
| 2004/0141651 A1 | * | 7/2004 | Hara et al. ................. 382/232 |
| 2009/0185792 A1 | * | 7/2009 | Braunstein et al. .......... 386/117 |

* cited by examiner

*Primary Examiner* — Asad M Nawaz
*Assistant Examiner* — Vitali Korobov

(57) ABSTRACT

A method is set forth for compressing a file of size C for storage in a memory space of size F, where C>F, comprising compressing successive portions of the file until C≦F, creating a header to the file including an offset value indicating a location separating compressed and uncompressed portions of the file, and appending the header to the file. A further method is set forth for executing a file comprising reading the header to determine the predetermined compression algorithm and the offset, copying the uncompressed portions from the memory to a RAM, decompressing the compressed portions starting at the offset, storing the decompressed portions of the load into RAM in sequence after the uncompressed portions, and executing the file from the RAM.

17 Claims, 6 Drawing Sheets

SYSTEM AND METHOD FOR STORING A PROGRAM USING PARTIAL COMPRESSION

FIELD

This specification relates in general to memory, and more particularly to a method for storing a program in a memory using partial compression.

BACKGROUND

Voice communication between users in medium size and large businesses is typically established over a network, such as a LAN or a WAN, for example, using IP phones. An IP phone customarily incorporates a TFTP (Trivial File Transfer Protocol) client for downloading software loads. TFTP is a simple file transfer protocol used for downloading bootcode to diskless devices, such as IP phones. TFTP is set forth in RFC 1350 published by the Network Working Group in July 1992. When the IP phone is first connected to the network or when software upgrades are required, the TFTP client downloads a software load of executable binary files from a central TFTP server, such as a PBX, for storage in a flash memory (ROM, PROM, EPROM, EEPROM, etc. . . . ) of the device.

In order to execute the downloaded program, the device must first load the program from flash memory to RAM using a small program known as a bootloader. Although the size of such executable program files is approximately only 256 KB in older systems, the size has grown to approximately 4 MB for modern IP phones, and continues to grow. If the storage space in flash memory is smaller than the space required to store the program, it is known in the art to fully compress the program before it is stored.

For example, U.S. Pat. No. 5,530,847 ("System and method for loading compressed embedded diagnostics") discloses a system and method for loading code from an EEPROM to RAM. When the space available on the EEPROM is smaller than the code, the code is compressed before being stored in the EEPROM. When the code is retrieved from the EEPROM, it must first be decompressed before it is loaded into RAM. Decompressing a program that has been fully compressed can be very time consuming (e.g. up to one minute), especially if the device bootloader does not have cache memory enabled.

U.S. Pat. No. 6,282,643 B1 discloses a BIOS application that loads uncompressed and compressed code into RAM at initialization. The portion of code that is compressed remains the same irrespective of memory available in the RAM.

In addressing the problem of decompression time, it is known in the art either to increase the available space in the flash memory or use a low efficiency compression algorithm. The former solution can significantly increase the cost of the flash memory, whereas the latter solution requires the bootloader to support multiple compression algorithms, thereby also increasing complexity and cost.

SUMMARY

According to an aspect of this specification, a method is described for storing software, such as a boot image of a program, into a storage space, such as a flash memory, to allow fast retrieval of the stored program for subsequently execution from, for example, RAM. Preferably, only a portion of the software is compressed for storage in the storage space and an offset is calculated and stored indicating the location in the software file when compression begins.

By compressing only a portion of the software file such that the load fits into the available space in memory, the time to decompress the software file is significantly reduced since only a small portion thereof is required to be decompressed (e.g. a small portion at the end of the load). Moreover, the method set forth herein accommodates any method of compression, thereby alleviating a requirement for the bootloader to support multiple compression algorithms.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION TO THE DRAWINGS

DETAILED DESCRIPTION

Figure 1:
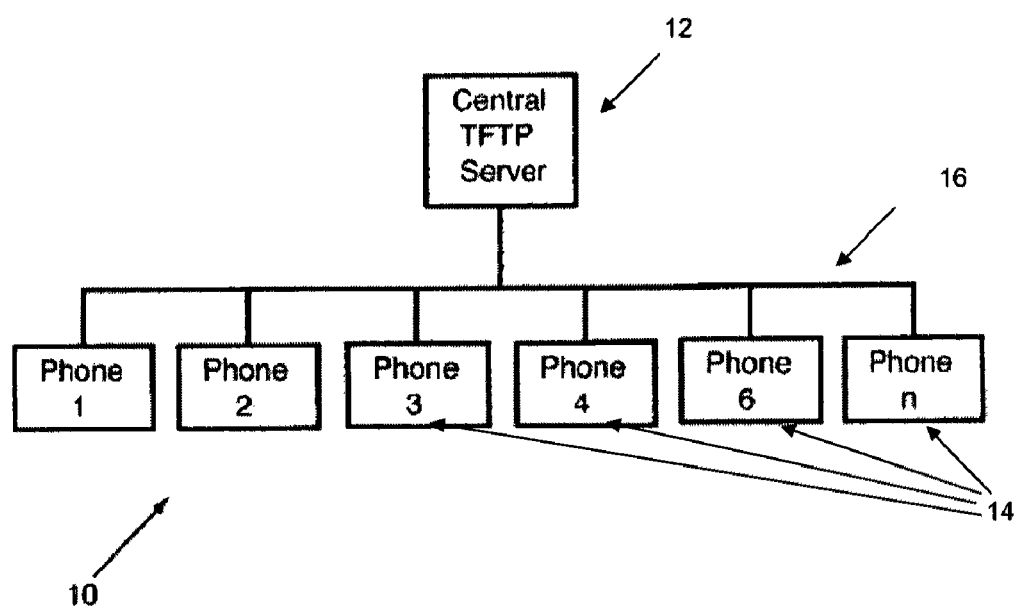
FIG. 1 is a block diagram of an exemplary PBX network.

FIG. 1 is a schematic overview of a conventional PBX network 10. The network 10 includes a central TFTP server 12 and a plurality of IP phones 14 (Phone 1, Phone 2, Phone 3 . . . Phone n). The phones are linked to the central TFTP server 12 via a local area network 16 (LAN) in a manner that is well known in the art. The phones may alternatively be linked to the TFTP server 12 via a wireless connection or any medium that supports a TCP/IP network. Each phone contains a TFTP client for downloading software from the central TFTP server, as discussed in greater detail below.

Figure 2:
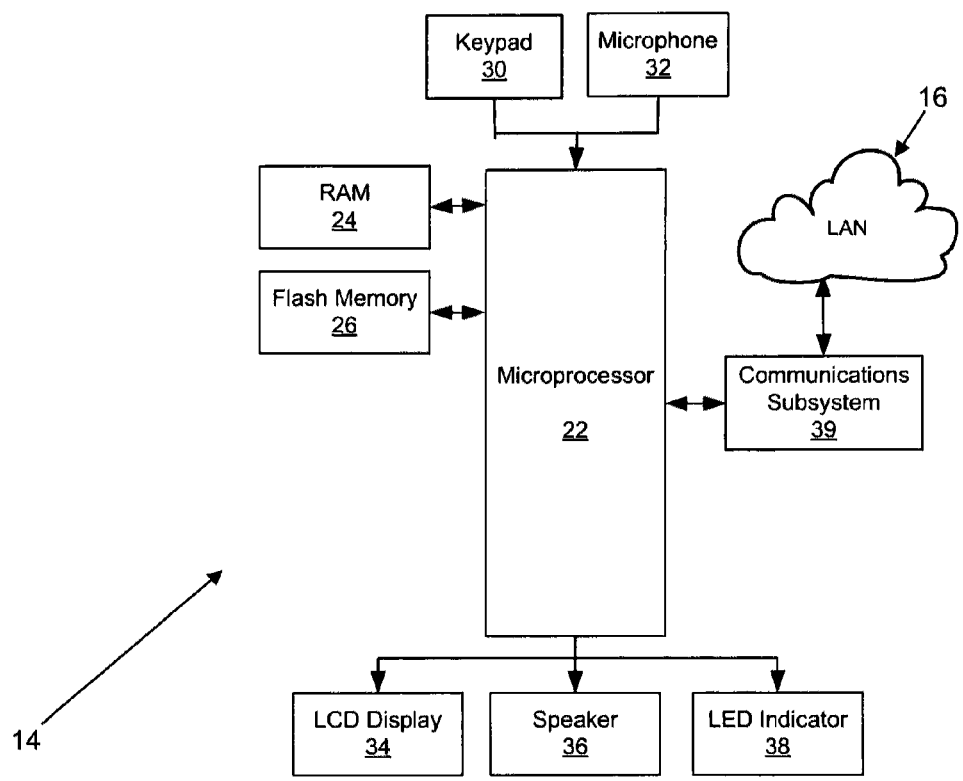
FIG. 2 is a block diagram of an exemplary IP phone.

Turning to FIG. 2, the internal functional elements of an exemplary IP phone 14 (e.g., Phone 1, Phone 2, Phone 3 . . . Phone n) are illustrated. The IP phone is based on a microcomputer that includes a microprocessor 22 connected to a random access memory (RAM) unit 24 and a persistent storage device, such as flash memory 26. As discussed above, operating system software executable by the microprocessor 22 is initially downloaded from the TFTP server 12 over LAN 16 via a communications subsystem 39, and stored in the flash memory 26. The microprocessor 22 receives input from various input devices including a keypad 30 and a microphone 32 and outputs to various output devices including an LCD display 34, a speaker 36 and an LED message waiting indicator 38.

When the phone powers up, it copies the executable software load from flash memory 26 to RAM 24. More particularly, the phone initializes by running a small bootstrap code located in flash memory 26. This code instructs microprocessor 22 to copy the main load to RAM 24 and then run the main load from RAM 24.

However, as indicated above, only a fixed amount of space is reserved in flash memory 26 for the load. If the load fits within the pre-allocated space without any need for compression, then it is stored uncompressed. However, according to an aspect of this specification if the load is too large to be stored in flash memory 26, the load is partially compressed. The portions of the software load that are compressed vary based on size of the load and the storage capacity of flash memory 26. For example, only the end portions of the load may be compressed (i.e. portions of the code stored at higher memory addresses of the flash memory 26). The size of the compressed portions is defined such that the total size of the load (both uncompressed and compressed portions) fits the available space in flash memory 26. According to another aspect of this specification, a small header is inserted at the beginning of the software load that includes an identification of the compression algorithm used and an offset value indicating where the compressed portions of code begin. Microprocessor 22 reads the header and makes a direct copy of the uncompressed portions of the load in RAM 24, and decompresses the compressed portions and copies them to RAM, following the uncompressed portions.

Figure 3:
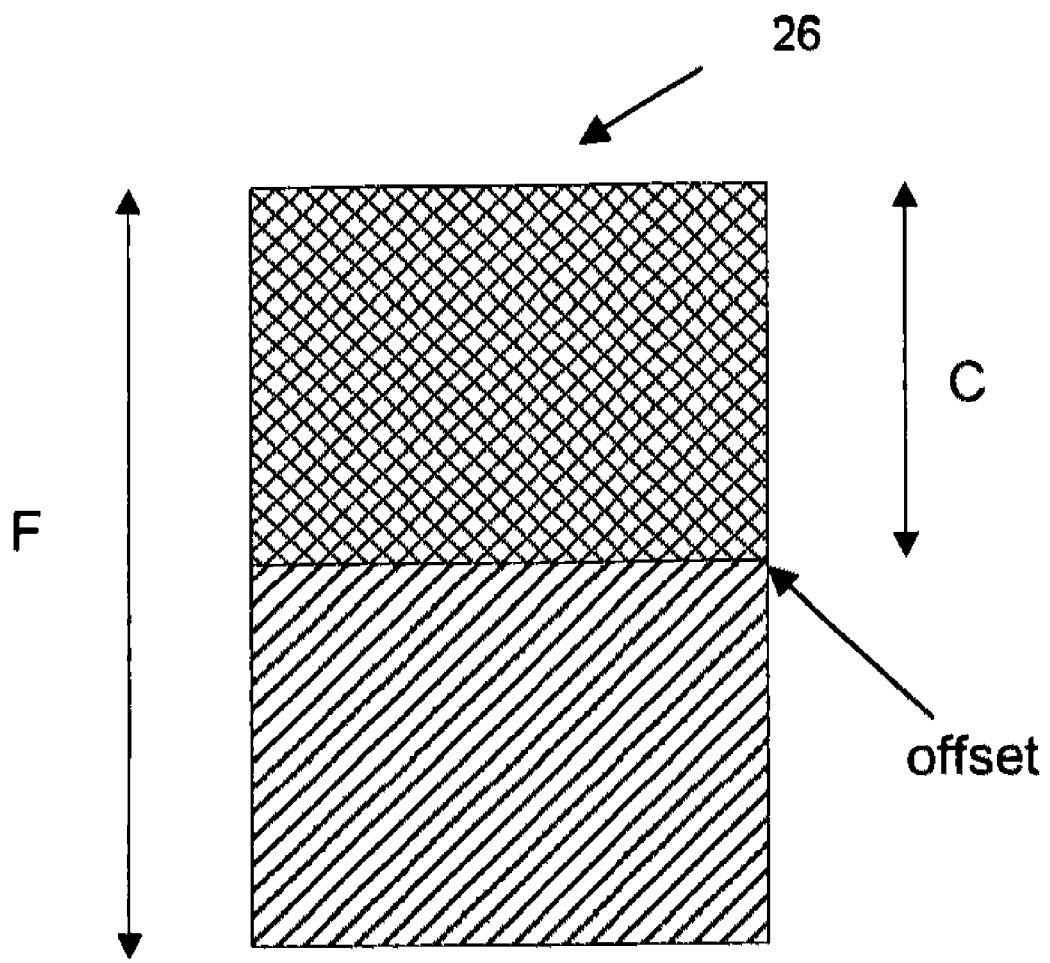
FIG. 3 is a schematic diagram of a flash memory with a partially compressed software file, according to a preferred embodiment.
Figure 4:
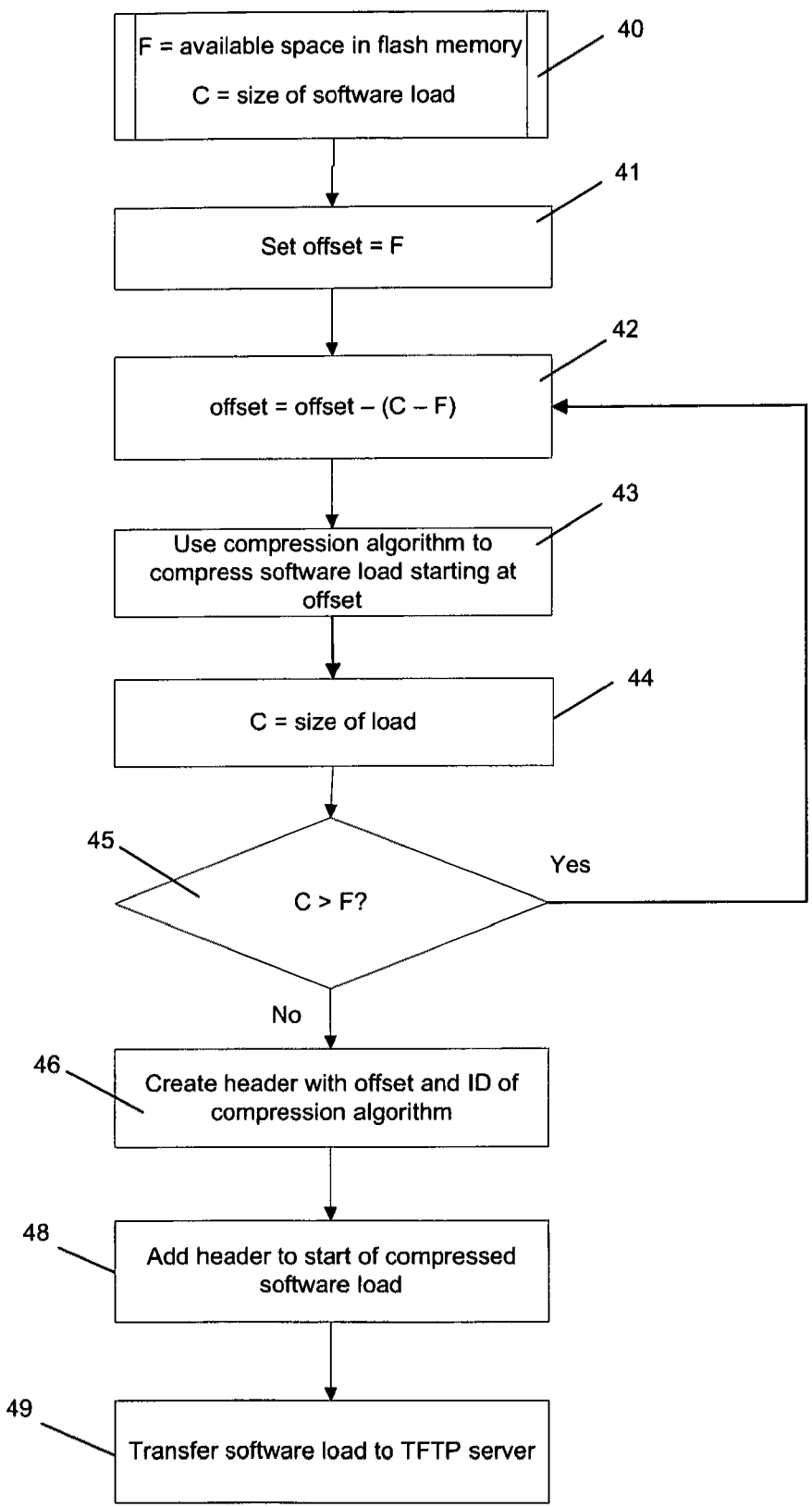
FIG. 4 is a flowchart showing a method of creating a compressed software file for storage in a flash memory as depicted in FIG. 3, according to an exemplary embodiment.

According to an exemplary embodiment, compression of the main software load may be performed on a PC during the software build and transferred to the TFTP server 12, as shown in FIG. 4, along with the header. Referring to FIGS. 3 and 4 together, the compression method of the preferred embodiment starts by defining variable F as the size of flash memory 26 and variable C as the size of the uncompressed load (step 40).

Next, an offset value is initialized to F, where offset indicates the location within the software load where the compression starts (step 41). The offset value is then set to offset—(C−F) (step 42). A compression algorithm is then used to compress the software load, starting at the location indicated by the offset value (step 43). In one embodiment, only a portion of the load is required to be compressed to fit in the available space of flash memory 26, thus, it may be preferable to use a very efficient compression algorithm, such as the adaptive Huffman algorithm. However, it should be appreciated that any compression algorithm can be used.

After the compression step, the variable C is set to the size of the partially compressed software load (step 44). A comparison is performed to determine if C continues to be larger than F (step 45). If so, then steps 42, 43 and 44 are re-executed.

Once C≦F, indicating that the software load has been sufficiently compressed to fit in flash memory 26, the header is created including the current value of offset and an indicator of the compression algorithm (e.g. adaptive Huffman algorithm) used to partially compress the software load (step 46). The header is then added to the partially compressed software load (step 48) and the software load (with added header) is transferred to the TFTP server 12 (step 49).

Exemplary source code for implementing the method of FIG. 4 is as follows:

---

Let F be the size of the available space in Flash for storing the load.
Let C be the size of the software load.
C = size of the uncompressed load
Offset = F
While (C > F)
{
 offset = offset − (C − F)
 compress the load starting at offset
 C = size of partially compressed load
}
Store the offset in a header, which will be read by the bootstrap code

---

When the IP phone 14 is first connected to the network 16, or when software upgrades are required, a TFTP client within the phone 14 downloads the software load from TFTP server 12 to flash memory 26 in the usual manner.

Figure 5:
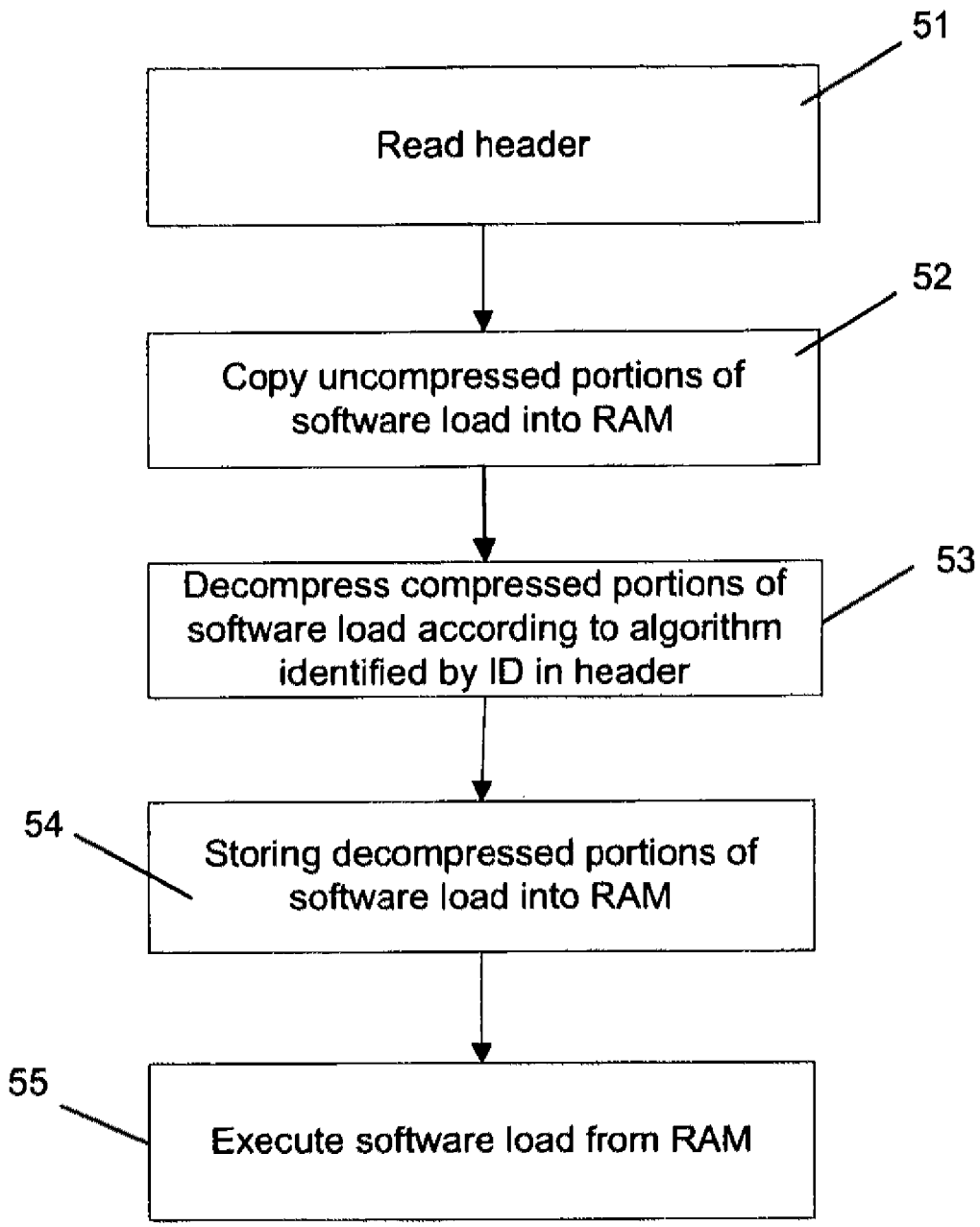
FIG. 5 is a flowchart showing a method of decompressing the software file for execution as depicted in FIG. 3, according to an exemplary embodiment.

FIG. 5 shows steps performed by the microprocessor 22 of phone 14 executing the bootstrap code (bootloader) during phone initialization. First, microprocessor 22 reads the header of the software load (step 51) to determine which decompression algorithm to use, and to determine the location of the offset. The uncompressed portions of the load are then copied from flash memory 26 into RAM 24 from the beginning of the load up to the offset, where compression starts (step 52). Microprocessor 22 then begins decompressing the main load from flash memory 26 (step 53) according to the decompression algorithm indicated in the header, and stores the decompressed portions of the load into RAM 24 in sequence after the previously copied uncompressed portions (step 54). Finally, the code jumps to where the load has been copied in RAM 24 and microprocessor 22 executes the main load (step 55).

Figure 6:
FIG. 6 shows an exemplary phone having a display for showing progress of decompressing the software file for execution.

In some circumstances, it may be desirable to provide the user of an electronic device, such as an IP phone, with feedback on the progress of decompressing the software file during boot-up. In the absence of such feedback, the user may be left with the impression that his/her phone has gone "dead". FIG. 6 illustrates a phone 14 including a display screen 63, such as a touch-screen LCD display, and a message waiting lamp 65, such as an LED, as well as other convention features such as a handset, buttons, speaker, etc. It is contemplated that the progression of decompression of the software file can be displayed on screen 63. For example, the progress of decompression may be displayed as in terms of the percentage of code that has been compressed, the size of the code prior to compression, and/or the size of the compressed code, all of which are known as a result of the method steps set forth in FIGS. 4 and 5. Also, it is contemplated that while displaying the progression of the decompression on display screen 63, the message waiting lamp 65 may be caused to flash. The decompression method of FIG. 5 is implemented very early during the initialization (i.e. booting) of the IP phone 14, at which time normally only the cache and memory have been initialized. Therefore, in order to implement the decompression progress display function display driver code is added to the bootstrap code and the decompression code is modified to generate the desired feedback decompression progress. Alternately, operating system (OS) code may be added to the bootstrap code.

As will be understood from the foregoing, the method set forth herein permits the use of a single efficient compression algorithm for partially compressing data to fit within a limited amount of storage. If the relative sizes of the uncompressed software load and flash memory 26 are such that there is no need for extensive compression then, instead of relaxing the compression algorithm as in the prior art, the method set forth herein compresses only a portion of the file using a single (efficient) compression algorithm. Accordingly, the method set forth herein is algorithm independent.

The many features and advantages of the method set forth herein will be apparent from the detailed specification and, thus, it is intended by the appended claims to cover all such features and advantages. Also, the method set forth herein may be advantageously applied to other devices than IP phones within a communication system. Indeed, any device with a CPU and memory (or hard disk) can use the method set forth herein to store any data file into a memory having a pre-defined or limited amount of storage capacity. Further, since numerous modifications and changes will readily occur to those skilled in the art, it is not desired to limit the claims to the exact construction and operation illustrated and described, and accordingly all suitable modifications and equivalents may be resorted to, falling within the scope of the claims.

What is claimed is:

1. A method of storing data in a communication system comprising a plurality of IP phones communicating with a server over a network, the method, comprising:
    partially compressing a data of size C to a size F, where C>F, by initializing a variable offset=F;
    setting said variable to offset=offset—(C−F);
    storing successive uncompressed portions of said data in successive locations of a server memory up to but not including a location indicated by said variable offset;
    compressing and storing successive portions of said data according to a predetermined compression algorithm in successive locations of said memory starting at said location indicated by said variable offset;
    creating a header including said variable offset for indicating said location that separates compressed and uncompressed portions of said data and an identifier of said predetermined compression algorithm; and
    appending said header to said data stored in said server memory,
    wherein each of said phones includes a client for downloading said data from the server to a persistent storage device of size F, and executing said data by reading said header to determine said predetermined compression algorithm and said variable offset, copying said uncompressed portions from said persistent storage device to a random access memory, decompressing said compressed portions starting at said location indicated by said variable offset, storing the decompressed portions into said random access memory in sequence after said uncompressed portions, and executing said data from said random access memory.

2. The method of claim 1, wherein said predetermined compression algorithm is adaptive Huffman algorithm.

3. The method of claim 1, wherein said data is an executable binary file.

4. A method of executing an executable binary file stored in said memory according to the method of claim 1, comprising:
    reading said header to determine said predetermined compression algorithm and said variable offset;
    copying said uncompressed portions from said memory to a random access memory;
    decompressing said compressed portions starting at said location indicated by said variable offset;
    storing the decompressed portions into said random access memory in sequence after said uncompressed portions; and
    executing said executable binary file from said random access memory.

5. The method of claim 4, wherein said memory is flash memory.

6. The method of claim 1, further comprising displaying a progress of said compressing of said data.

7. The method of claim 1, implemented within an embedded device.

8. The method of claim 7, wherein said embedded device is an IP phone.

9. The method of claim 4 further comprising displaying a progress of one or both of said compressing and said decompressing of said data.

10. The method of claim 7, wherein said IP phone includes a liquid crystal display.

11. A communication system, comprising:
    a plurality of IP phones communicating with a server over a network; and said server configured to:
        partially compress software code of size C to a size F, where C>F, by initializing a variable offset=F, setting said variable to offset=offset—(C−F),
        store successive uncompressed portions of said software code in successive locations of server memory up to but not including a location indicated by said variable offset,
        compress and store successive portions of said software code according to a predetermined compression algorithm in successive locations of said server memory starting at said location indicated by said variable offset,
        create a header including said variable offset for indicating said location that separates compressed and uncompressed portions of said software code and an identifier of said predetermined compression algorithm, and
        append said header to said software code stored in said server memory;
    wherein each of said phones includes a client for downloading said software code from the server to a persistent storage device of size F, and executing said software code by reading said header to determine said predetermined compression algorithm and said variable offset, copying said uncompressed portions from said persistent storage device to a random access memory, decompressing said compressed portions starting at said location indicated by said variable offset, storing the decompressed portions into said random access memory in sequence after said uncompressed portions, and executing said software code from said random access memory.

12. The communication system of claim 11, wherein said persistent storage device is as flash memory.

13. The communication system of claim 11, wherein said software code is operating system software for said plurality of IP phones.

14. The communication system of claim 11, wherein said network is a local area network.

15. The communication system of claim 11, wherein said network is a wireless network.

16. The communication system of claim 11, wherein each of said IP phones includes a display for indicating progress of said compression.

17. The communication system of claim 16, wherein said display is a liquid crystal display.

* * * * *